(12) United States Patent
Fujihira

(10) Patent No.: US 6,426,563 B1
(45) Date of Patent: Jul. 30, 2002

(54) SEMICONDUCTOR DEVICE AND METHOD FOR MANUFACTURING THE SAME

(75) Inventor: Mitsuaki Fujihira, Yokohama (JP)

(73) Assignee: Sumitomo Electric Industries, Osaka (JP)

( * ) Notice: Subject to any disclaimer, the term of this patent is extended or adjusted under 35 U.S.C. 154(b) by 0 days.

(21) Appl. No.: 09/604,802

(22) Filed: Jun. 28, 2000

(30) Foreign Application Priority Data

Jun. 28, 1999 (JP) .......................... 11-181948

(51) Int. Cl.$^7$ ............................... H01L 23/48
(52) U.S. Cl. ................... 257/780; 257/781; 257/782; 257/784; 257/786
(58) Field of Search ................. 257/780–782, 257/784, 786

(56) References Cited

U.S. PATENT DOCUMENTS

| | | | | |
|---|---|---|---|---|
| 4,067,039 A | * | 1/1978 | Gaicki .......................... | 257/784 |
| 4,845,543 A | * | 7/1989 | Ohkawa et al. .............. | 257/781 |
| 5,101,263 A | * | 3/1992 | Kitano et al. ................ | 257/781 |
| 6,034,440 A | * | 3/2000 | Ball ............................. | 257/786 |
| 6,180,891 B1 | * | 1/2001 | Murdeshwar ................ | 257/780 |
| 6,232,561 B1 | * | 5/2001 | Schmidt et al. ............. | 174/260 |

FOREIGN PATENT DOCUMENTS

| | | |
|---|---|---|
| DE | 197 44 266 A1 | 4/1998 |
| JP | 55-118643 | 9/1980 |
| JP | 1-158742 | 6/1989 |
| JP | 2-114545 | 4/1990 |
| JP | 8-340019 | 12/1996 |
| WO | WO 98/21780 | 5/1998 |

* cited by examiner

Primary Examiner—Jasmine J B Clark
(74) Attorney, Agent, or Firm—Smith, Gambrell & Russell

(57) ABSTRACT

A semiconductor device includes a lower conductive member, an upper conductive member and a conductive wire. The one end of the conductive wire is electrically connected to a semiconductor chip. The lower conductive member is formed on a lead frame. The conductive wire is sandwiched between the lower conductive member and the upper conductive member located thereon and is electrically connected to the lead frame. A connecting portion of the conductive wire connected to the lead frame is sandwiched between the lower and upper conductive members so that the neck portion of the conductive wire can be protected from above.

10 Claims, 9 Drawing Sheets

FIG. 4A
FIG. 4B
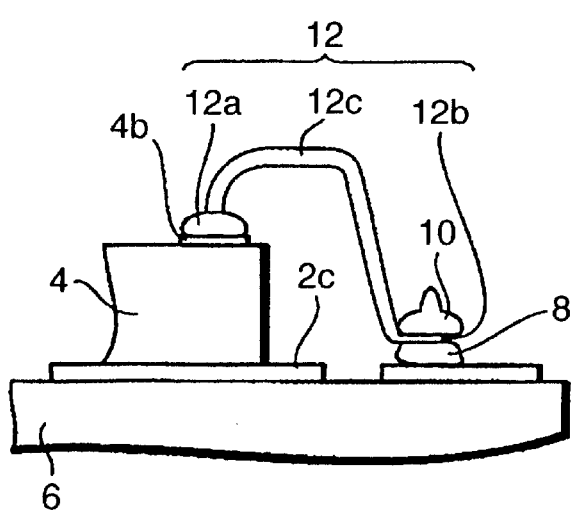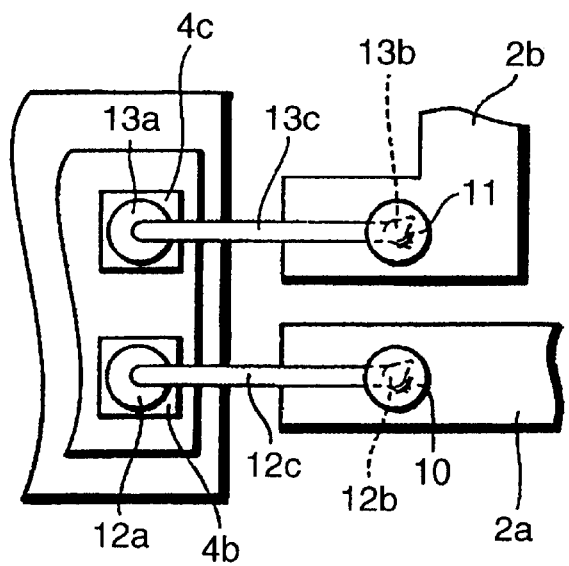

BREAKAGE STRENGTH (g)
OF WIRE NECK PORTION

SEMICONDUCTOR DEVICE AND METHOD FOR MANUFACTURING THE SAME

BACKGROUND OF THE INVENTION

1. Field of the Invention

The present invention relates to a semiconductor device having a semiconductor chip and a wiring member to be electrically connected to the semiconductor chip and a method of manufacturing the semiconductor device.

2. Description of the Related Art

In a semiconductor device, a semiconductor chip and a lead frame incorporating it, are electrically connected by a bonding wire. In a wire bonding step, a ball is formed on the tip of a boning wire, the ball is fixed to the pad on a semiconductor chip. Next, the bonding wire is extended onto the lead frame and connected a lead frame. Thereafter, the bonding wire is cut.

Such a wire bonding technique is disclosed in e.g. JP-A55-118643. The technique disclosed therein relates to awire bonding technique of bonding an Au wire to an Al face. As disclosed in this reference, when the Au wire is fixed to the Al face, intermetallic compound will be generated at the interface therebetween and the boundary is made fragile so that the bonding strength becomes insufficient. In order to overcome such an inconvenience, the invention disclosed in the reference has been accomplished.

However, as the case may be, the semiconductor device manufactured by the above technique cannot also provide sufficient bonding strength under its utilizing environment.

For example, the strength of wire bonding may be reduced according to the chemical state of the surface of the pad of a semiconductor chip, terminal of a package and lead frame. In such a case, the bonding wire is broken when a smaller strength than the strength of a wire strand itself is applied. The inventors of the invention have found that where the wire bonding strength was reduced, the sectional area of the neck portion (just near a ball portion formed at the top end) of the bonding wire had been reduced. If expansion and shrinkage of mold resin of a resin-sealed semiconductor chip, which is thus wire-bonded in such a condition, great strength is applied to a bonding wire of the semiconductor chip. Therefore, the semiconductor device is falied at the portion having a smaller area of the bonding wire.

SUMMARY OF THE INVENTION

An object of the invention is to provide a semiconductor device which can prevent reduction in the tension leading to breakage of a bonding wire and a method for manufacturing such a semiconductor device.

A semiconductor device according to the invention includes a lower conductive member, an upper conductive member and a conductive wire. The lower conductive member is formed on a wiring member to be electrically connected to the semiconductor chip. The one end of the conductive wire is electrically connected to a semiconductor chip. The other end of the conductive wire is sandwiched between the lower conductive member and the upper conductive member located thereon and is electrically connected to the wiring member. Thus, the semiconductor chip is electrically connected to the wiring member through the conductive wire.

The connecting portion of the conductive wire to be connected to the wiring member is sandwiched between the lower and upper conductive members so that the neck portion of the conductive wire can be protected from above by the upper conductive member. Therefore, such a structure having both lower and upper conductive members has an increased bonding area of the conductive wire between both conductive members as compared with the structure provided with only the lower conductive member and hence provides an increased bonding strength. Further, the lower conductive member is formed on the lower side of the conductive wire. Therefore, in bonding, the lower conductive member is deformed so that deformation of the conductive wire itself is suppressed and reduction in the sectional area of the neck portion of the conductive wire is also suppressed.

A semiconductor device according to the invention includes a lower conductive member, a second connecting member and a conductive wire. The lower conductive member is formed on a wiring member to be electrically connected to a semiconductor chip. The second connecting member having an upper conductive member formed on said lower conductive member and a connecting portion connected to said wiring member at a different position from said lower conductive member. The one end of the conductive wire is electrically connected so said semiconductor chip. The other end of the conductive wire is sandwiched between said lower and upper conductive members and electrically connected to said lower conductive member.

The neck portion is protected by the upper conductive member. In addition, the lower conductive member to which the other end of the conductive wire is bonded is bonded to the wiring member. The other end of the conductive wire is also bonded to the upper conductive member of the second connecting member. The second connecting member is bonded to the wiring member at a different position from the lower conductive member. Further, since the conductive wire is connected to the wiring member at plural connecting positions, the tension applied to the conductive wire is dispersed at the plural connecting positions. Therefore, since the tension applied to each of the plural connecting positions is reduced on average, even if there is a distribution of the bonding strength, the margin for the limit of the strength leading to flaking of the bonding can be assured.

The semiconductor device according to the invention includes a first connecting member, a second connecting member and a conductive wire. The first connecting member has a lower conductive member formed on a wiring member to be electrically connected to a semiconductor chip and a connecting portion connected to the wiring member at a different position from said lower conductive member. The second connecting member has an upper conductive member formed on said lower conductive member and a connecting portion connected to said wiring member at a different position from said lower conductive member. The one end of the conductive wire is electrically connected to said semiconductor chip. The other end thereof is sandwiched between said lower and upper conductive member and electrically connected to said lower conductive member.

The neck portion is protected by the upper conductive member. In addition, the other end of the conductive wire is bonded to the wiring member through the lower conductive member and also bonded to the upper conductive member of the second connecting member. The first and the second connecting member are bonded to the wiring member at different positions from the lower conductive member, respectively. Therefore, the conductive wire is connected to the wiring member through the lower conductive member and the first and the second connecting member. Thus, the bonding area between the conductive wire and the wiring member is increased so that bonding strength therebetween is increased. Further, since the conductive wire is connected to the wiring member at plural connecting positions, the tension applied to the conductive wire is dispersed at the plural connecting positions. Therefore, since the tension applied to each of the plural connecting positions is reduced on average, even if there is a distribution of the bonding strength, the margin for the limit of the strength leading to flaking of the bonding can be assured.

Preferably, the lower and the upper conductive member and the conductive wire are made of the same material. Because of a metallographic nature, the bonding strength will be made greater between the same kinds of metal than between the different kinds of metal. A wavelength of the light, which the light emitting element and the light receiving element has sensivity, is permeable to the mold resin.

The semiconductor device according to the invention preferably includes mold resin for sealing the semiconductor chip and wiring member. The semiconductor chip can include at least one of a light emitting element and a light receiving element. The light relative to the light emitting element and light receiving element is preferably permeable to the mold resin.

Where the semiconductor device is sealed by mold resin, its strength for the stress applied when the mold resin is expanded or shrunken can be increased. Particularly, such a semiconductor device is suitable when it is molded by transparent resin because the transparent resin and the wiring member such as a lead frame have different thermal expansion coefficients.

The present invention relates to a method of manufacturing a semiconductor device in which a semiconductor chip and a wiring member are electrically connected to each other. Therefore, the invention comprising the steps of (1) a first step of forming a lower conductive member on said wiring member; (2) a second step of connecting the one end of a conductive wire to said semiconductor chip; (3) a third step of connecting said conductive wire to said lower conductive member; and (4) a fourth step of forming an upper conductive member on said lower conductive member through said conductive wire.

Since the lower conductive member is provided before the conductive wire is connected to the wiring member, the conductive portion can be provided which can absorb the stress applied in bonding to the portion to which the conductive wire is connected. Therefore, the deformation of the conductive wire can be decreased. Further, since the upper conductive member is provided on the lower conductive member through the conductive wire after the conductive wire has been connected to the lower conductive member, the neck portion of the conductive wire formed when the conductive wire is connected to the lower conductive member can be protected.

The method of manufacturing a semiconductor device according to the invention can further comprise, after said fourth step, (5) the step of fixing a conductive portion extending from said upper conductive member to said wiring member at a different position from said lower conductive member.

The upper conductive member protects the neck portion and is bonded to the conductive wire. Therefore, if the conductive portion extending from the upper conductive member is bonded to the wiring member, the entire bonding strength is increased.

The method of manufacturing a semiconductor device can further comprise, prior to said second step, (6) the step of bonding a conductive portion extending from said lower conductive member to said wiring member at a different position from said lower conductive member.

The lower conductive member is bonded to the conductive wire. Therefore, if the conductive portion extending from the lower conductive member is bonded to the wiring member, the entire bonding strength is increased.

The method of manufacturing a semiconductor device according to the invention can, further comprises (7) a step of preparing the semiconductor chip having one of a light receiving element and a light emitting element and the wiring member prior to said first step; and (8) a step of sealing said wiring member and said semiconductor chip connected to said wiring member through said conductive wire using mold resin.

After the neck portion is protected by the upper conductive member, the wiring member and semiconductor chip are sealed by mold resin. When stress is applied to the conductive wire owing to the expansion and shrinkage of the mold resin for sealing, the breakage of the conductive wire at the neck portion is difficult to occur. The light relative to the light receiving element and the light emitting element is permeable to the mold resin.

In the semiconductor device and the method of manufacturing it according to the invention, the wiring member may be a lead frame on which the semiconductor device is mounted, or another semiconductor chip different from the semiconductor chip. Thus, the present invention can be applied to both cases where the wiring member is the semiconductor chip and lead frame.

BRIEF DESCRIPTION OF THE DRAWINGS

In the accompanying drawings:

FIG. 4A is a side view showing the step after an upper conductive member has been formed, and FIG. 4B is a plan view thereof;

PREFERRED EMBODIMENTS OF THE INVENTION

Figure 1:
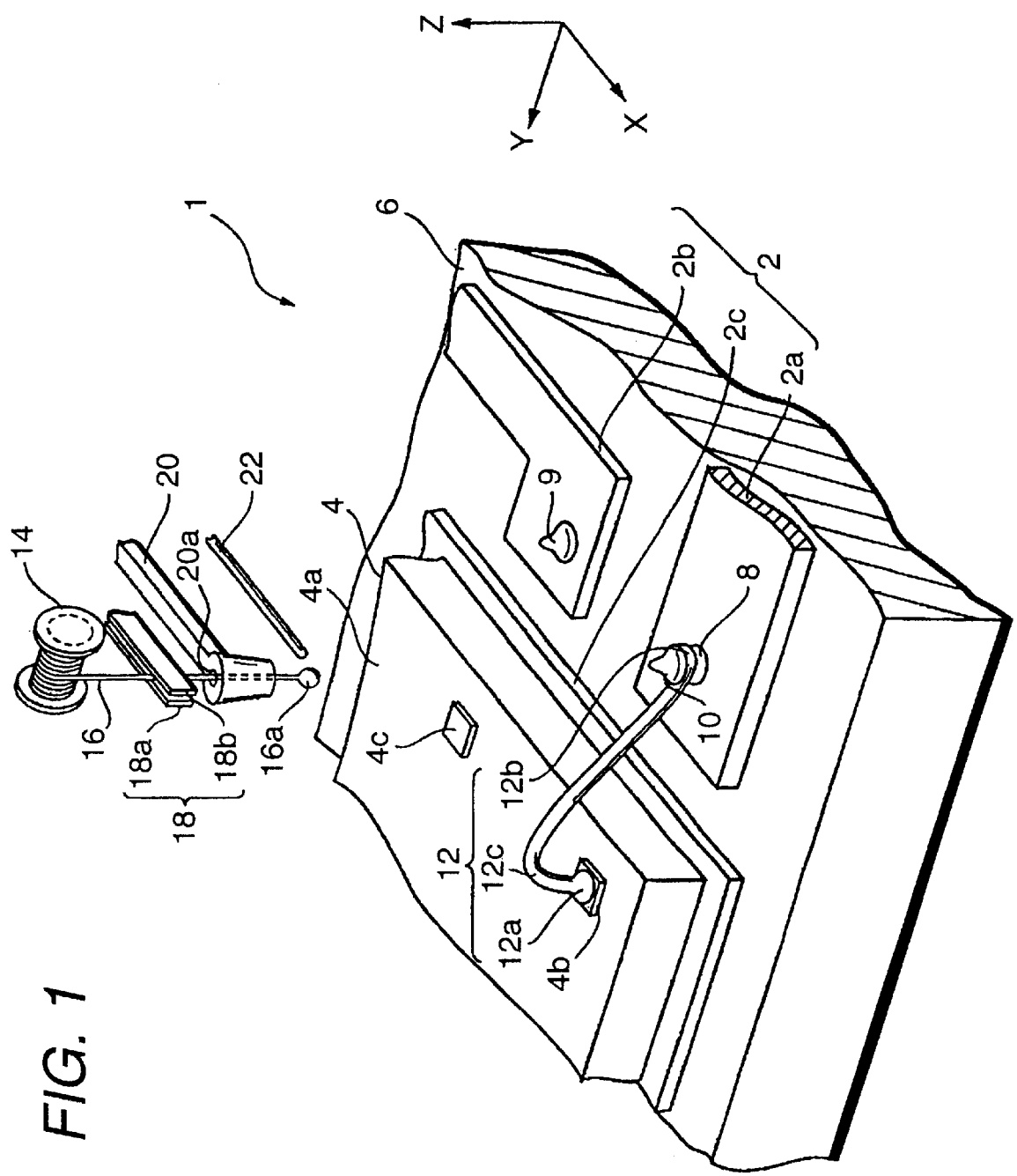
FIG. 1 is a perspective view showing the manner of connecting a semiconductor chip to a lead frame through a conductive wire.

Referring to the drawings, an explanation will be given of modes for carrying the invention. In the following description, in order to avoid overlapped explanation, like reference numerals refer to like portions.

First Embodiment

FIG. 1 is a perspective view of a manner of connecting a wiring member such as a lead frame 2 to a semiconductor chip through a conductive wire 12. The semiconductor chip 4 is mounted on the lead frame 2. The lead frame 2 is arranged on a stage 6 of a bonding device 1. A wire spool 14 for the bonding device 1 houses a bonding wire used for bonding in a wound state. The bonding wire 16, when it is pulled out from the wire spool 14, is guided onto the stage 6 via a clamper 18 and a capillary 20. In this case, in the clamper 18, the bonding wire 16 passes between a pair of holding plates 18a and 18b. In the capillary 20, the bonding wire 16 further passes from the one end to the other end of a through-hole 20a. At a cut end portion of the bonding wire 16, a ball 16a is formed in such a manner that the cut end is heated and molten using a discharge conductive member 22. The stage is movable in both X and Y directions in FIG. 1 in a state where the lead frame 2 and the semiconductor chip 4 are placed. On the other hand, the capillary 20 is movable in a Z direction.

The lead frame 2 includes a plurality of inner leads 2a, 2b and an island 2c. The semiconductor chip 4 is connected to the island 2c of the lead frame 2 by silver paste. On the main surface 4a of the semiconductor chip 4, a semiconductor device (not shown) and bonding pads 4b and 4c are formed. On the inner leads 2a and 2b, lower conductive member 8 and 9 are formed, respectively.

In the case of a Si-family semiconductor device, the conductive member pads 4b, 4c on the semiconductor chip are made of aluminum or aluminum alloy. In the case of a III-V group semiconductor device, the conductive member pads 4b, 4c are made of Au or Au alloy. The bonding wire 16 is a gold wire having a diameter of about 30 μm.

As seen from FIG. 1, the conductive member pad 4b and inner lead 2a are connected to each other by means of a bonding wire. A conductive wire 12 is composed of a ball conductive member 12a connected to the conductive member pad 4b, a connecting end 12b connected to the lower conductive member 8 on the lead frame and a connecting wire 12c which connects the ball conductive member 12a and the connecting end 12b. An upper conductive member 10 is provided on the connecting end 12b. In FIG. 1, a conductive member pad 4c is to be connected to an inner lead 2b.

Second Embodiment

Referring to FIGS. 2A–4B, an explanation will be given of a series of steps of connecting a lead frame 2 to a semiconductor chip 4 mounted thereon.

First, lower conductive members 8, 9 are formed of inner leads 2a, 2b. Although the lower conductive members 8, 9 can be formed of bumps such as a gold bump, copper bump and a solder bump, they are preferably formed in a convex shape which can be formed by melting the bonding wire 16 by discharge so as to be re-crystallized. In this way, the conductive member of a more soft material than the original wire material can be obtained. Since the lower conductive members 8, 9 are formed by melting the wire having the diameter of about 30 μm to form the ball and bump, the diameter of the lower conductive members 8, 9 becomes several tens μm. The case where the wire is molten to form the lower conductive members 8, 9 will be explained below.

Figure 2A:
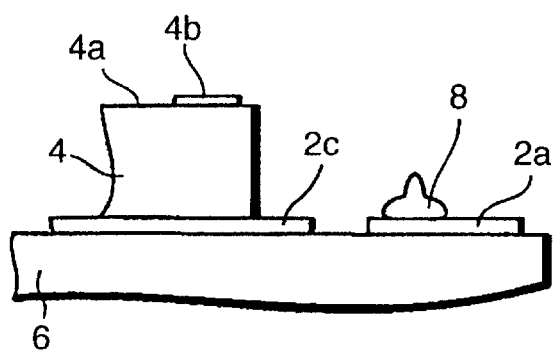
FIG. 2A is a side view showing the step after a lower conductive member has been formed on the lead frame.
Figure 2B:
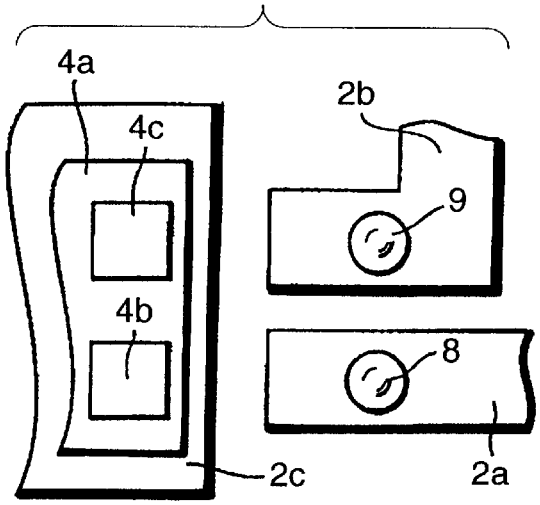
FIG. 2B is a plan view thereof.

By moving the stage 6 and capillary 20, the convex-shaped ball conductive member (FIG. 1) formed at the tip of the bonding wire 16 is fixed to the inner lead 2a. In this case, the crimping technique such as thermal crimping and ultrasonic thermal crimping is used. 1 First, the bonding wire 16 held by the holding members 18a, 18b is cut at the edge of the through-hole 20a of the capillary 20. Thus, the lower conductive members 8, 9 are formed on the inner leads 2a, 2b. FIGS. 2A and 2B show the state after the above step has been completed. FIG. 2A is a side view and FIG. 2B is a top view.

Figure 3A:
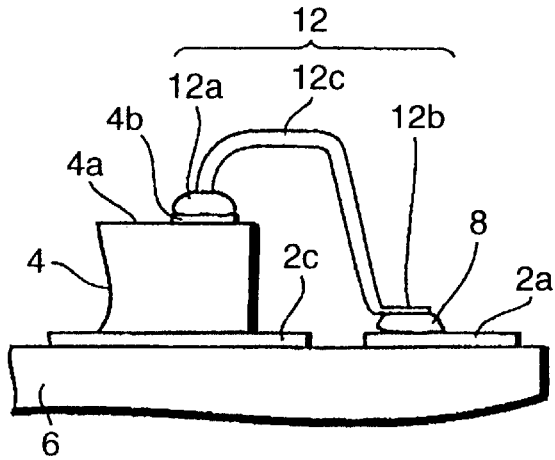
FIG. 3A is a side view showing the step after the semiconductor chip has been connected to an inner lead through the conductive wire.
Figure 3B:
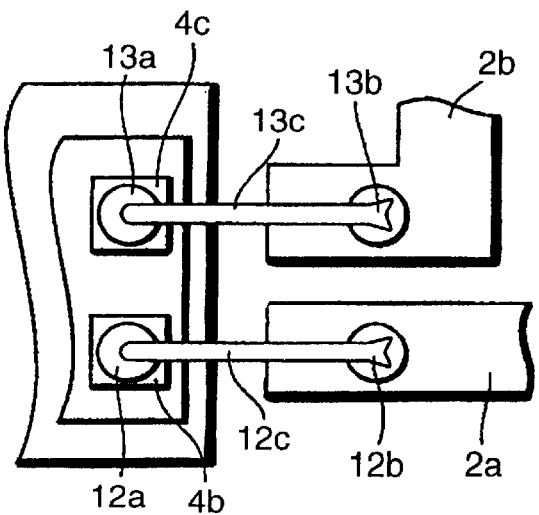
FIG. 3B is a plan view thereof.

Thereafter, the lead frame 2 and the semiconductor chip 4 will be connected to each other by the bonding wire 16. First, the cut end of the bonding wire 16 held by the capillary (20 in FIG. 1) is molten by discharge to form a ball-shaped conductive member. The stage 6 is moved so that the ball-shaped conductive member is located on the bonding pad 4b of the semiconductor chip 4. Using the above crimping technique, the ball-shaped conductive member is crimped on the bonding pad 4b. After the crimping, the bonding wire 16 is moved without being cut while it is continuously unreeled so that the bonding tool 20 is located on the lower conductive member 8 formed on the inner lead 2a. After the bonding wire 16 has been bonded to the lower conductive member 8, it is cut. Likewise, the bonding pad 4c is electrically connected to the lower conductive member 9. Thus, the bonding pads 4b, 4c of the semiconductor chip 4 are connected to the inner leads 2a, 2b, respectively. The conductive wire 12 contains a ball conductive member 12a on the pad 4b, a connecting end 12b and a conductive wire 12c connecting them to each other. The conductive wire 13 contains a ball conductive member 13a on the pad 4c, a connecting end 13b and a conductive wire 13c connecting them to each other. FIGS. 3A and 3B show the lead frame 2 and semiconductor chip 4 after the above step has been executed. FIG. 3A is a side view and FIG. 3B is a top view.

Next, upper conductive members 10 and 11 are formed on the lower conductive members 8 and 9. First, the cut end of the bonding wire 16 held by the capillary 20 is molten by discharge to form a ball-shaped conductive member. The stage 6 is moved so that the ball-shaped conductive member is located on the lower conductive member 8 provided on the inner lead 2a. Using the above crimping technique, the connecting end 12 is crimped on the lower conductive member 8. After the crimping, the bonding wire 16 is cut. Likewise, the upper conductive member 11 is provided on the lower conductive member 9. Thus, the upper conductive members 10 and 11 are formed. The connecting end 12b of the conductive wire 12 is sandwiched by the lower conductive member 8 and upper conductive member 9. The connecting end 13b of the conductive wire 13 is sandwiched by the lower conductive member 8 and upper conductive member 9 from its both sides. FIGS. 4A and 4B show the lead frame 2 and semiconductor chip 4 after the above step has been executed.

Figure 5A:
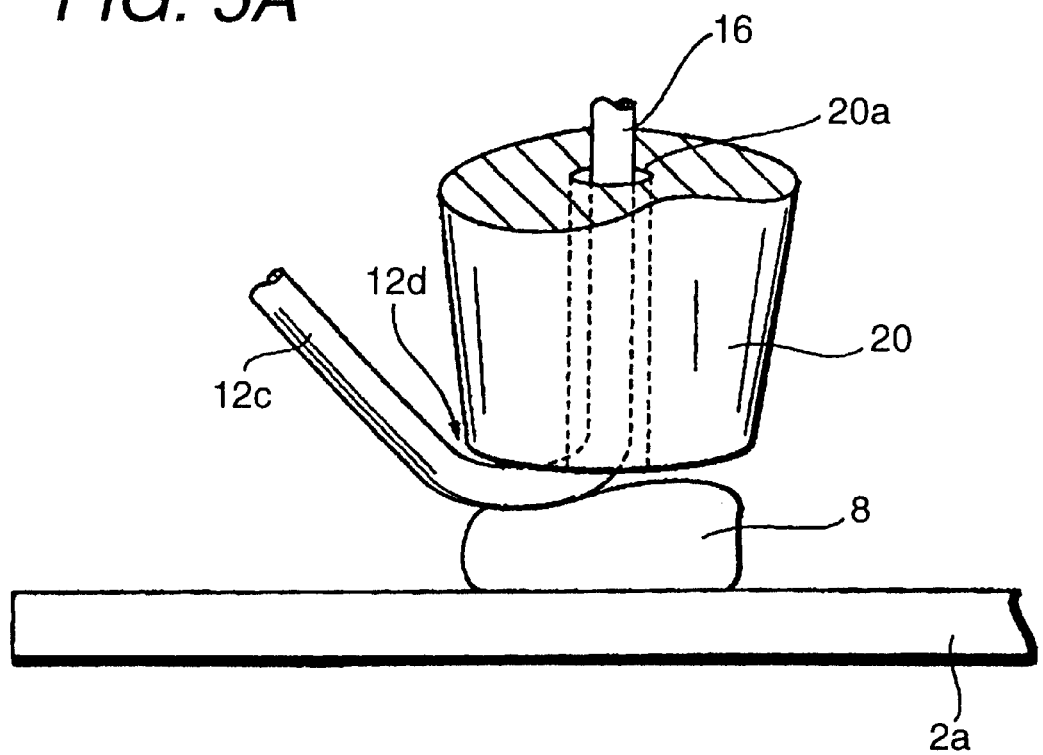
FIG. 5A and FIG. 5B are enlarged views of the manner of bonding the conductive wire onto the lower conductive member.
Figure 5B:
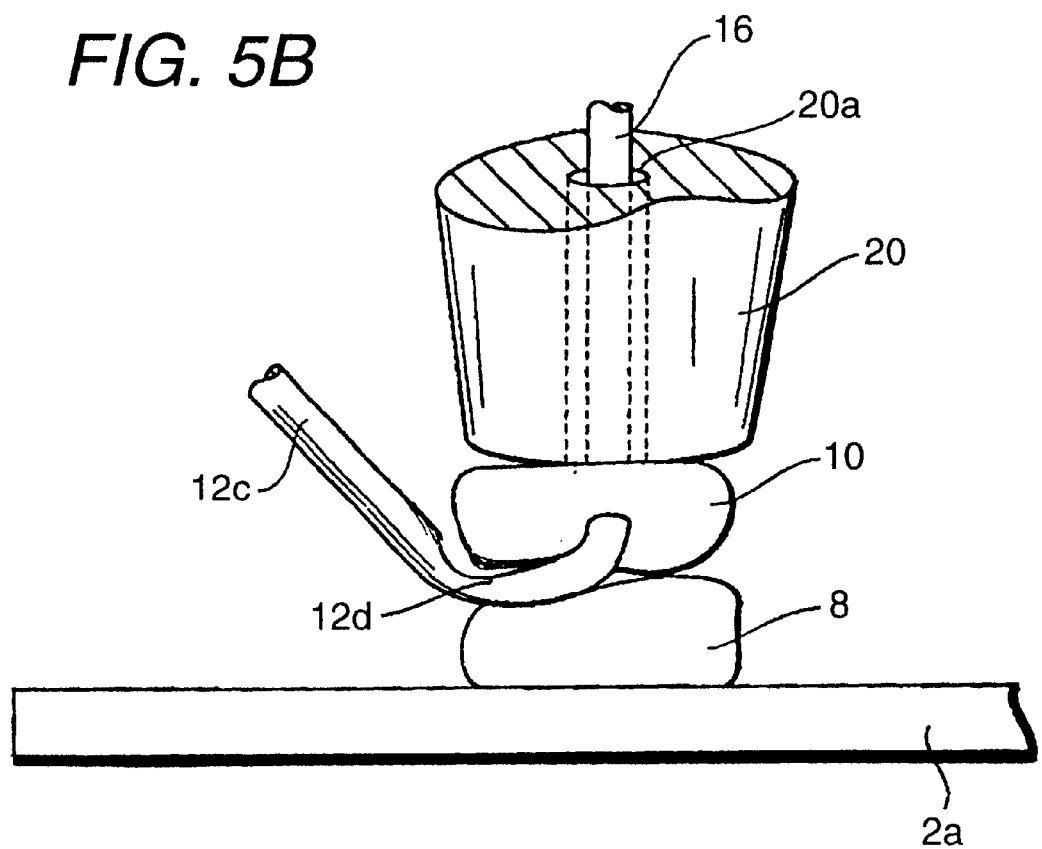
Figure 6A:
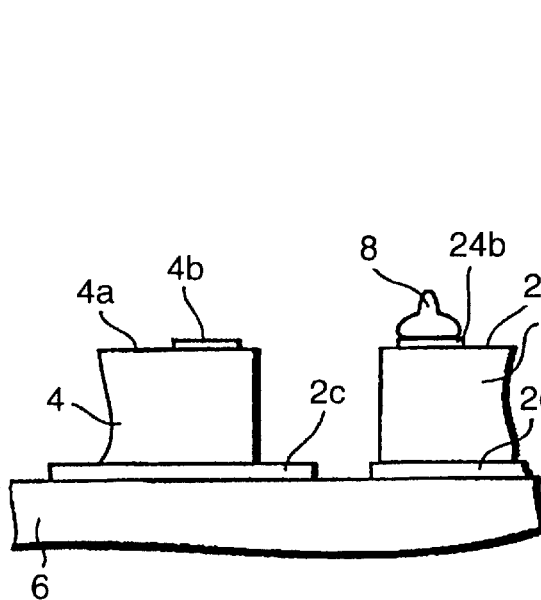
FIG. 6A is a side view showing the step after the lower conductive member has been formed on a semiconductor chip.
Figure 6B:
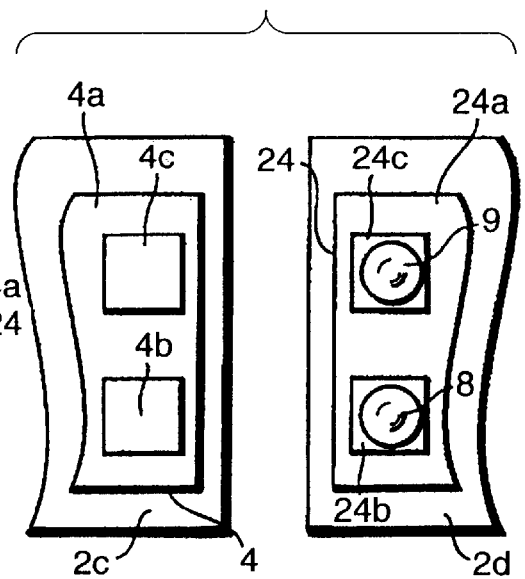
FIG. 6B is a plan view thereof.
Figure 7A:
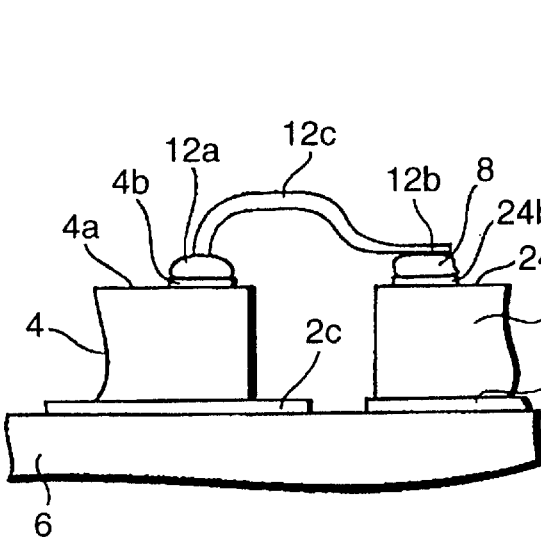
FIG. 7A is a side view showing the step after a semiconductor chip and another semiconductor chip have been connected to each other by a conductive wire.
Figure 7B:
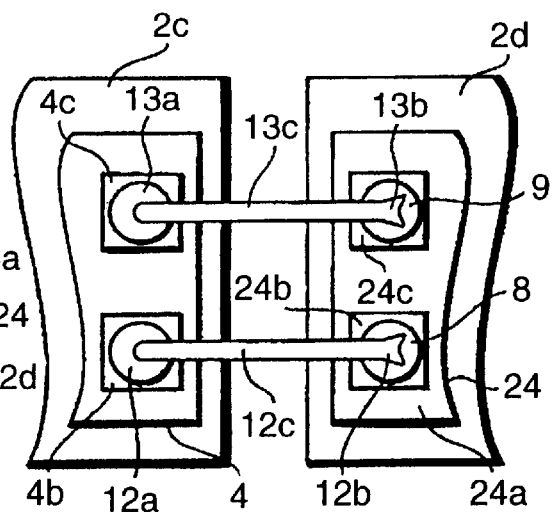
FIG. 7B is a plan view thereof.
Figure 8A:
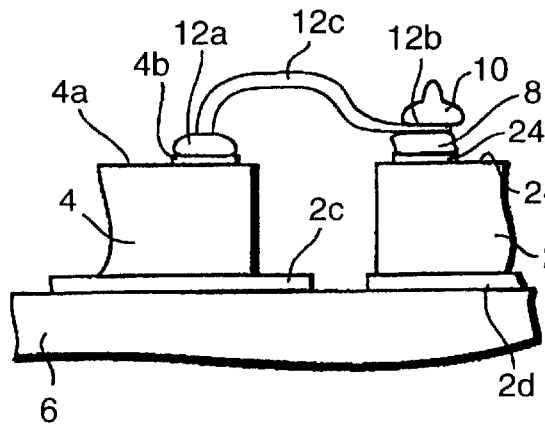
FIG. 8A is a side view showing the step after an upper conductive member has been formed.
Figure 8B:
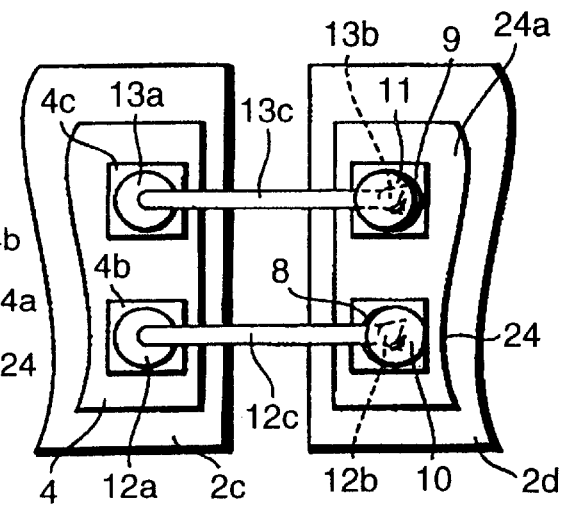
FIG. 8B is a plan view thereof.

FIGS. 5A and 5B are enlarged views showing the manner of bonding the conductive wire 12 to the lower conductive member 8.

FIG. 5A shows the manner of fixing the conductive wire 12 to the lower conductive member 8. For example, the lower conductive member 8 has a diameter of about 100 μm for the wire having a diameter of 30 μm. At the time of fixing, weight is applied from above in bonding. Therefore, the edge of the capillary 20 will be brought into contact with the side of the conductive wire 12. Accordingly, the conductive wire 12 has a neck portion 12d.

As seen from FIG. 5B, the connecting end 12b of the conductive wire 12 is sandwiched between the upper conductive member 10 and the lower conductive member 8. Since the upper conductive member 10 is formed to cover the neck portion 12d of the conductive wire 12 (the portion of the conductive wire 12 with which the edge of the capillary 20 is in contact) from above, the strength of the neck portion 12d is compensated for. In the embodiments described above, all of the lower conductive member 8, conductive wire 12 and upper conductive member 10 are made of the same kind of materials. The bonding strength among these three members is greater than that among different kinds of materials.

The connecting end 12b of the conductive wire 12 is sandwiched by the upper conductive member 10 and lower conductive member 8 from its both sides. For this reason, the total bonding area of the conductive wire 12 is increased as compared with the case of provision of only the lower conductive member 8, thereby increasing the bonding strength.

In fixing, since the lower conductive member 8 is deformed, the deformation of the conductive wire 12 itself can be suppressed. As a result, reduction of the sectional area in the neck portion 12d of the conductive wire 12 can be suppressed. This effect is particularly remarkable when the bonding wire 16 is recrystallized. The upper conductive member 10 is also formed by recrystallization of the bonding wire 16. Therefore, it is deformed in its bonding with the lower conductive member. Namely, its shape can be easily changed in accordance with the shape of the neck portion 12d so that the neck portion 12d can be protected.

Third Embodiment

Now referring to FIGS. 6A–8A, an explanation will be given of another embodiment in which the wiring member is another semiconductor chip.

FIGS. 6A–8B correspond to FIGS. 2A–4B, respectively. As seen from FIGS. 6A and 6B, another semiconductor chip 24 is mounted on an island 2d. On the main surface 24a of another semiconductor chip 24, bonding pads 24b and 24c are formed. On these bonding pads 24b and 24c, the lower conductive member 8 and 9 are formed, respectively. Therefore, the explanation of FIGS. 2A–4B can be applied to this mode except that the lower conductive members 8 and 9 are formed on the bonding pads 24b and 24c, not but on the inner leads 2a and 2c.

This mode can also provide the same operation and effect as that when the present invention is applied to the wiring member of a lead frame 2. In addition, if this connecting structure is provided, it is possible to realize the wire connection between chips by using the bonding pads having substantially same size.

Fourth Embodiment

Now referring to FIGS. 9A–11B, still another mode will be explained.

First, lower conductive members 8a, 9a are formed on inner leads 2a, 2b. The lower conductive members 8a, 9a are formed in a convex shape formed by melting the boding sire 16 by discharge so as to be re-crystallized as similar to the second embodiment.

Figure 9A:
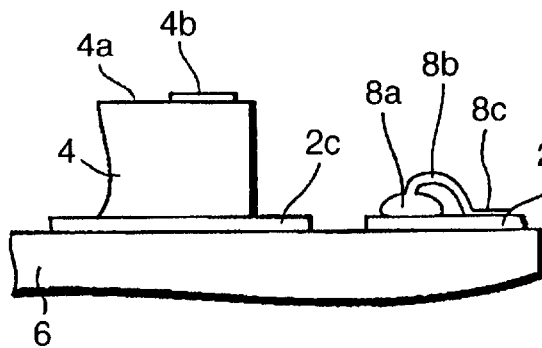
FIG. 9A is a side view showing the step after a lower conductive member has been formed on a lead frame.
Figure 9B:
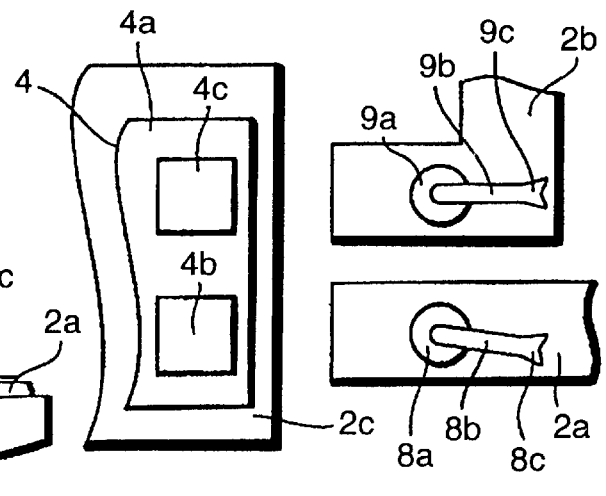
FIG. 9B is a plan view.

By moving the stage 6, the ball conductive member (see, FIG. 1) formed at the tip of the bonding wire 16 is fixed to the inner lead 2a. In this case, the crimping technique such as thermal crimping and ultrasonic thermal crimping is used. After the crimping, the stage 6 is moved to the positions different from the lower conductive members 8a, 9a and the bonding wire 16 is fixed to the inner leads 2a and 2b. This fixing can be carried out without forming the ball, but may be carried out by forming the ball. After fixing, the bonding wire 16 held by the holding members 18a, 18b is cut by the capillary 20. Each of the conductive wires thus formed is composed of a lower conductive member 8a, 9a, conductive portion 8c, 9c and a wire portion connecting them. The connecting portion 8c, 9c and the wire portion 8b, 9b are extended from the lower conductive member 8a, 9a. This permits the tension applied to the bonding portion to be dispersed. FIGS. 9A and 9B show the state after the above step has been completed. FIG. 9A is a side view and FIG. 9B is an top view.

Figure 10A:
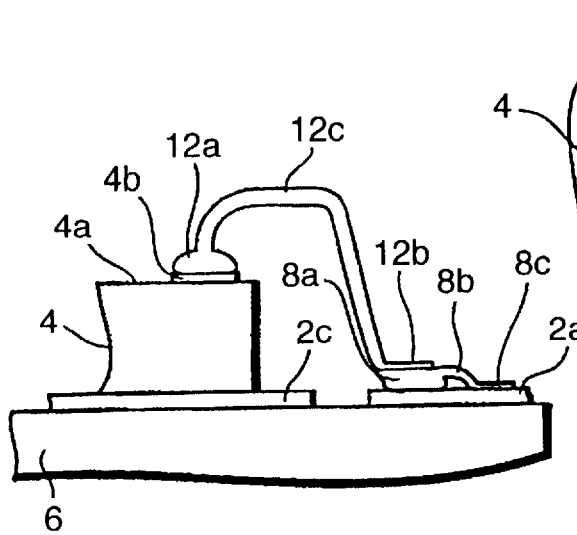
FIG. 10A is a side view showing the step after the semiconductor chip has been connected to an inner lead through the conductive wire.
Figure 10B:
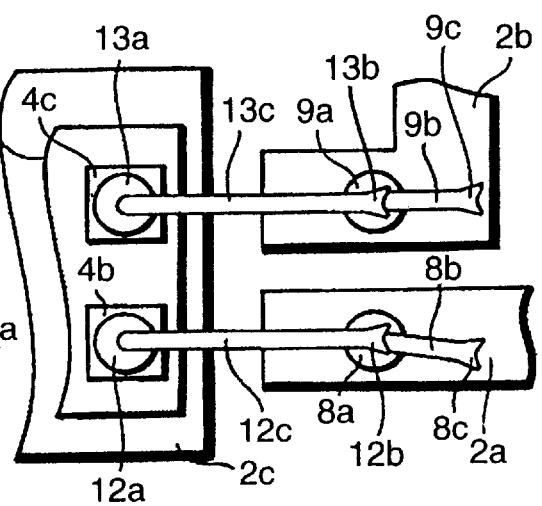
FIG. 10B is a plan view thereof.

Thereafter, the lead frame 2 and the semiconductor chip 4 will be connected to each other by the bonding wire 16. First, the cut end of the bonding wire 16 is molten by discharge to form a ball-shaped conductive member. The stage 6 is moved so that the ball-shaped conductive member is located on the bonding pad 4b of the semiconductor chip 4. Using the above the crimping technique, the ball-shaped conductive member is crimped on the bonding pad 4b. After the crimping, the bonding wire 16 is moved without being cut while it is continuously unreeled so that the capillary 20 is located on the lower conductive member 8 formed on the inner lead 2a. After the bonding wire 16 has been fixed to the lower conductive member 8, the bonding wire 16 is cut. Likewise, the bonding pad 4c is electrically connected to the inner lead 2b by the above crimping technique. Thus, the bonding pads 4b, 4c of the semiconductor chip 4 are connected to the inner leads 2a, 2b, respectively. The conductive wire 12 contains a ball conductive member 12a on the pad 4b, a connecting end 12b on the lower conductive member 8a and a conductive wire 12c connecting them to each other. The conductive wire 13 contains a ball conductive member 13a on the pad 4c, a connecting end 13b on the lower conductive member 9a and a conductive wire 13c connecting them to each other. FIGS. 10A and 10B show the lead frame 2 and semiconductor chip 4 after the above step has been executed. FIG. 10A is a side view and FIG. 10B is a top view.

Figure 11A:
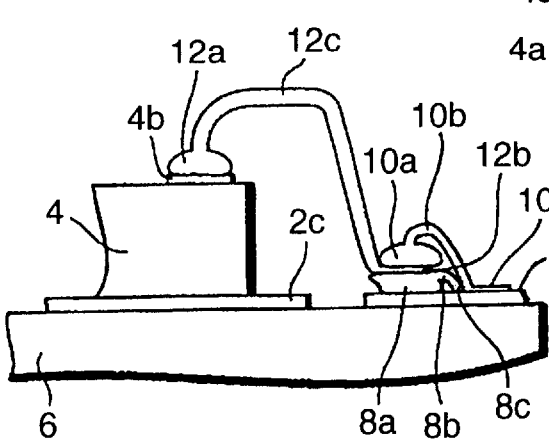
FIG. 11A is a side view showing the step after an upper conductive member has been formed.
Figure 11B:
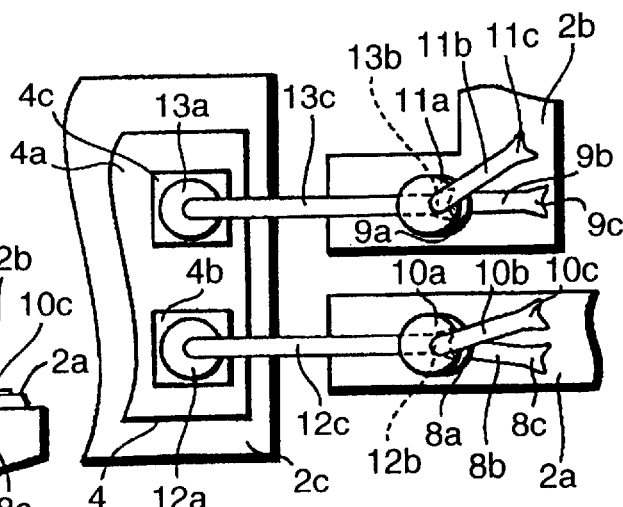
FIG. 11B is a plan view thereof.

Next, upper conductive members 10a and 11a is formed on the lower conductive members 8 and 9. First, the cut end of the bonding wire 16 is molten by discharge to form a ball-shaped conductive member. The stage 6 is moved so that the ball-shaped conductive member is located on the connecting end 2b of the conductive wire 12. Using the above crimping technique, the connecting end 12b is crimped on the lower conductive member 8a. After the crimping, the bonding wire 16 is fixed to the inner lead 2a at a different position from the lower conductive members 8a. The bonding can be carried out by the same technique as the crimping. Likewise, the upper conductive member 11a is formed on the conducting end 13b of the conductive wire 13 and bonded to the inner lead 2b at the position 11c different from the lower conductive member 9a. Thus, the one connecting member contains the upper conductive member 10a, connecting portion 10c and wire portion 10b connecting them, whereas the other connecting member contains the upper conductive member 11a, connecting portion 11c and wire portion 11b connecting them. The connecting end 12b of the conductive wire 12 is sandwiched by the lower conductive member 8a and upper conductive member 10a from its both sides. The connecting end 13b of the conductive wire 13 is sandwiched by the lower conductive member 9a and upper conductive member 11a. FIGS. 11A and 11B show the lead frame 2 and semiconductor chip 4 after the above step has been executed. FIG. 11A is a side view and FIG. 11B is a top view.

This embodiment can also provide the same operation and effect as the second embodiment. Namely, on the lower conductive member 8a, 9a and connecting end 12b, 13b, the upper conductive member 10a, 11a made of the same material as that of these members is provided. The fixing area of the connecting ends 12b, 13b of the conductive wires with the upper and lower conductive members is increased. Further, the upper conductive members 10a, 11a is formed to cover the connecting end 12b, 13b of the conductive wire 12, 13. Therefore, the upper conductive members 10a serves to protect the neck portion of the conductive wire 12, 13 from above. Such a structure can greatly improve the breaking strength against the tension applied to the conductive wire 12.

Further, in this embodiment, an anchor structure is provided in which the upper conductive member 10a (11a) and the connecting portion 10c (11c) formed integrally with it and the corresponding lower conductive member 8a (9a) and the connecting portion 8c (9c) formed integrally with it are fixed to the inner lead 2a (2b) at a plurality of positions. Such a structure permits the tension applied to the conductive wire 12, 13 to be dispersed at the plurality of fixing points. The anchor structure can be adopted in at least one of the lower conductive member and upper conductive member.

Figure 12:
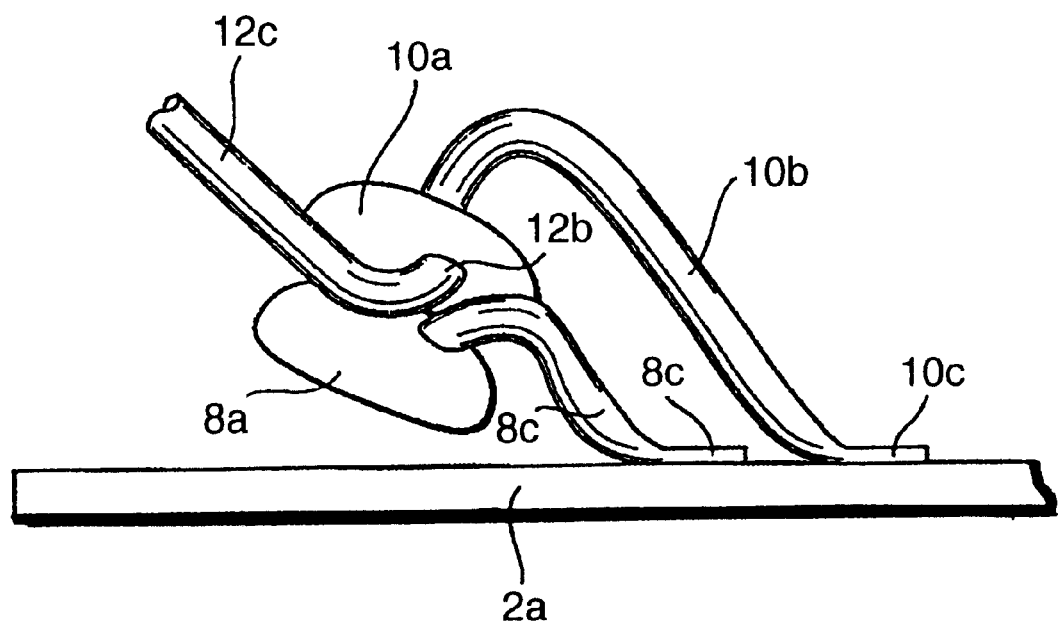
FIG. 12 is a schematic view showing the state where the lower conductive member has been peeled off.

If the separation as shown in FIG. 12, the anchor structure prevents the electrical connection and mechanical bonding from being lost completely.

The method according to the invention can be applied to the semiconductor chip 4, 24 having at least one of the a light receiving element and a light emitting element, or any other active elements.

The semiconductor chip 4, 24 in which the electrical connection to the conductive wire has been completed can be sealed together with the lead frame 2 using mold resin. Further, the semiconductor chips 4 and 24 are integrally or individually sealed by mold resin.

After the semiconductor chip 4, 24 is electrically connected to the wiring member so that the neck portion 12d is protected by the upper conductive member 10, it is sealed using the mold resin. For this reason, when the stress is applied to the conductive wire 12 owing to the expansion and shrinkage of the mold resin for sealing, the conductive wire 12 is difficult to break at the neck portion 12d. With respect to the resin for sealing the light receiving and light emitting elements, the resin should be permeable to the light having a wavelength in which these elements has sensitivity. Therefore, the stress relaxation agent which relaxes the stress of the mold resin can not be added to the resin. However, the semiconductor device according to the invention can be effectively applied to such a case.

Figure 13:
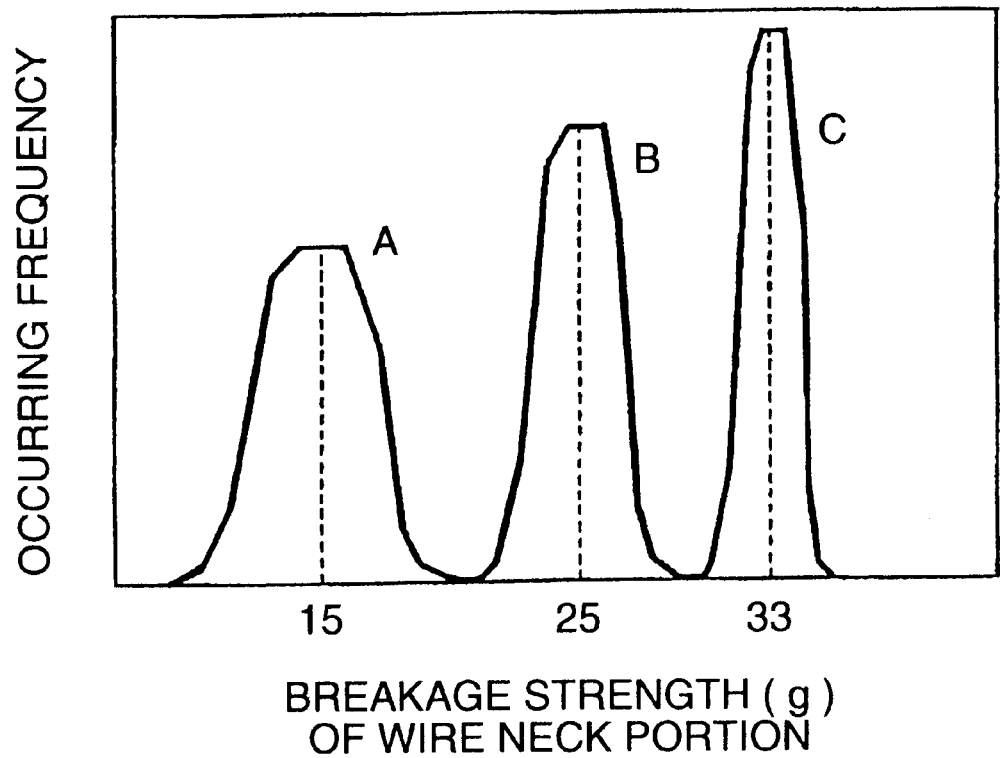
FIG. 13 is a characteristic view showing an experimental result in a mode for carrying out the invention.

FIG. 13 shows the result of the breakage strength test executed for the semiconductor device shown in FIGS. 4A and 4B according to the mode for carrying out the invention. In FIG. 13, the abscissa indicates the breakage strength of the neck portion in gram (g), and the ordinate indicates its occurring frequency in a relative value. In FIG. 13, three remarkable peaks A, B and C appear. Peak A is located at the position of the breakage strength of about 15 g which corresponds to the data relative to the conventional structure in which both lower conductive member and upper conductive member are not provided. Peak B is located at the position of the breakage strength of about 25 g which corresponds to the structure in which the upper conductive member is not provided. Peak C is located at the position of the breakage strength of about 33 g which corresponds to the structure according to the invention in which both lower and upper conductive members are provided. In the order of the peak A –peak C, the dispersion is decreased. Thus, it has been verified that the structure corresponding to the peak C exhibits not only a great strength but also stabilized characteristic.

Figure 14:
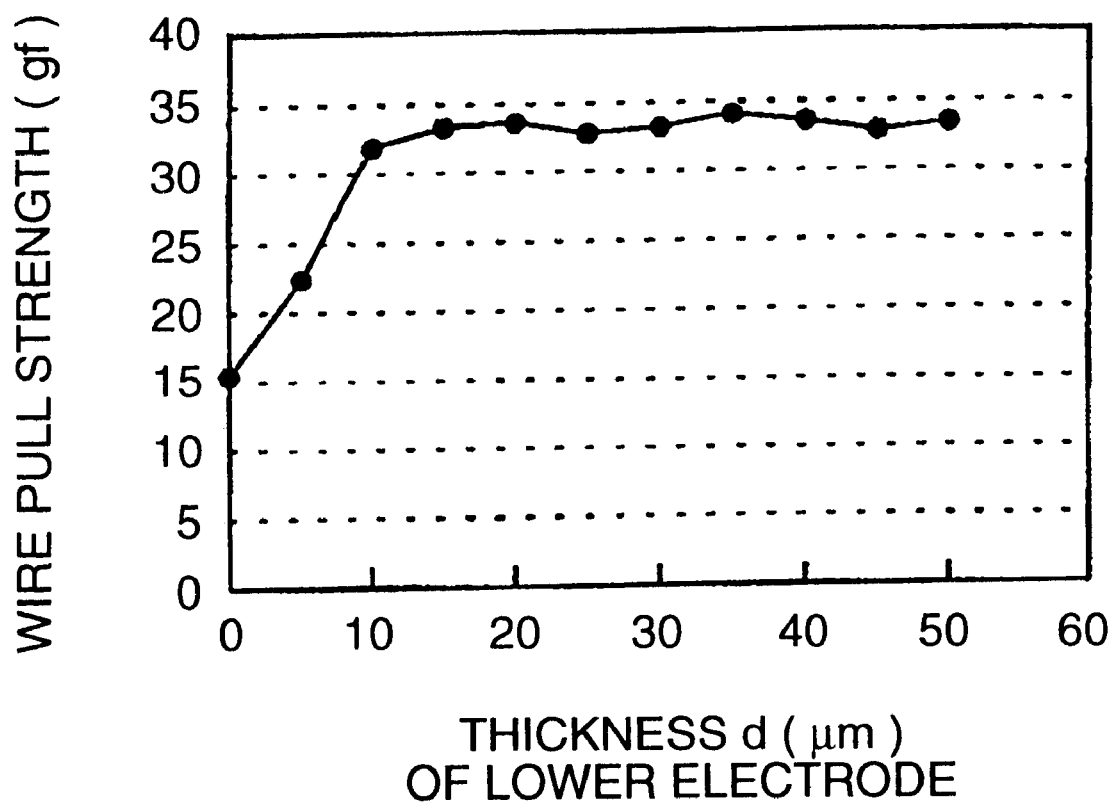
FIG. 14 is a characteristic view showing a wire-pull-strength.

It was verified from the experiment by the inventors that the thickness of the lower conductive member is preferably 10 $\mu$ or more in the modes for carrying out the invention. FIG. 14 is a characteristic view with the thickness d of the lower conductive member in abscissa and the wire-pull-strength indicative of a wire pulling strength in ordinate. The thickness d of the lower conductive member denotes the value when it is connected to the conductive wire.

The present invention is clearly different from the technology disclosed in JP-A-55-118643. In the technology disclosed in this reference, ball bond and stitch bond are made on the Al surface using a bonding wire. In such a structure, the bonding wire is once connected to the ball bond formed on the Al surface and thereafter extended to the stitch bond. Therefore, the bonding wire has no connecting end. No conductive member is formed on the ball band. Therefore, the electric connecting area between the bonding wire and ball bond is small and bonding area is also small.

As described in detail referring to the drawings, the connecting portion of the conductive wire to be connected to the wiring member is sandwiched between the upper and lower conductive members. Therefore, the neck portion of the conductive wire can be protected by the upper conductive member so that the neck portion can be reinforced. In addition, the total bonding area of the conductive wire is increased as compared with the case of the provision of only the lower conductive member, and hence the bonding strength is increased. Further, since the lower conductive member is formed on the lower side of the connecting portion of the conductive wire, the lower conductive member is deformed. Therefore, the deformation of the conductive wire itself is suppressed. Thus, reduction in the sectional area of the neck portion of the conductive wire can also be suppressed.

In the method of manufacturing a semiconductor device according to the invention, the lower conductive member is provided before the conductive wire is connected to the wiring member. Therefore, it can provide a conductive portion capable of absorbing the stress applied in bonding at the portion to which the conductive wire is to be fixed. Therefore, the deformation of the conductive wire can be suppressed. Further, since the upper conductive member is provided on the lower conductive member through the conductive wire after the conductive wire has been connected to the lower conductive member, the neck portion of the conductive wire formed when the conductive wire is connected to the lower conductive member can be protected by the upper conductive member.

Thus, in accordance with the invention, a semiconductor device capable of reducing breakage of a bonding wire and a method of manufacturing it can be provided.

What is claimed is:

1. A semiconductor device comprising:
a lower conductive member formed on a wiring member to be electrically connected to a semiconductor chip;
a conductive wire having the one end electrically connected to said semiconductor chip and the other end electrically connected to said lower conductive member; and an upper conductive member formed on said lower conductive member so as to sandwich the other end of said conductive wire.

2. The semiconductor device according to claim 1, wherein said wiring member is a lead frame on which said semiconductor chip is mounted.

3. The semiconductor device according to claim 1, wherein said wiring member is another semiconductor chip different from said semiconductor chip.

4. The semiconductor device according to claim 1, further comprising mold resin for sealing said semiconductor chip and said wiring member;
wherein said semiconductor chip includes at least one of a light emitting element and a light receiving element, and a wavelength of the light, which said light emitting element and said light receiving element has sensivity, is permeable to said mold resin.

5. A semiconductor device comprising:
a first connecting member having a lower conductive member formed on a wiring member to be electrically connected to a semiconductor chip and a connecting portion connected so said wiring member at a different position from said lower conductive member;
an upper conductive member formed on said lower conductive member; and
a conductive wire having the one end electrically connected to said semiconductor chip and the other end sandwiched said lower and upper conductive members and electrically connected to said lower conductive member.

6. The semiconductor device according to claim 5, wherein said wiring member is a lead frame on which said semiconductor chip is mounted.

7. The semiconductor device according to claim 5, further comprising mold resin for sealing said semiconductor chip and said wiring member;
wherein said semiconductor chip includes at least one of a light emitting element and a light receiving element, and a wavelength of the light, which said light emitting element and said light receiving element has sensivity, is permeable to said mold resin.

8. A semiconductor device comprising:
a first connecting member having a lower conductive member formed on a wiring member to be electrically connected to a semiconductor chip and a connecting portion connected. to the wiring member at a different position from said lower conductive member;
a second connecting member having an upper conductive member formed on said lower conductive member and a connecting portion connected to said wiring member at a different position from said lower conductive member; and
a conductive wire having the one end electrically connected to said semiconductor chip and the other end sandwiched between said lower conductive member and said upper conductive member and electrically connected to said lower conductive member.

9. The semiconductor device according to claim 8, wherein said wiring member is a lead frame on which said semiconductor chip is mounted.

10. The semiconductor device according to claim 8, further comprising mold resin for sealing said semiconductor chip and said wiring member;
wherein said semiconductor chip includes at least one of a light emitting element and a light receiving element, and a wavelength of the light, which said light emitting element and said light receiving element has sensivity, is permeable to said mold resin.

* * * * *